United States Patent
Tamura et al.

(10) Patent No.: US 9,200,795 B2
(45) Date of Patent: Dec. 1, 2015

(54) LIGHTING DEVICE

(71) Applicants: CITIZEN HOLDINGS CO., LTD., Tokyo (JP); CITIZEN ELECTRONICS CO., LTD., Yamanashi (JP)

(72) Inventors: Ryo Tamura, Yamanashi (JP); Takashi Akiyama, Yamanashi (JP)

(73) Assignees: CITIZEN HOLDINGS CO., LTD., Tokyo (JP); CITIZEN ELECTRINOCS CO., LTD., Yamanashi (JP)

( * ) Notice: Subject to any disclaimer, the term of this patent is extended or adjusted under 35 U.S.C. 154(b) by 250 days.

(21) Appl. No.: 13/905,232

(22) Filed: May 30, 2013

(65) Prior Publication Data

US 2013/0334974 A1 Dec. 19, 2013

(30) Foreign Application Priority Data

Jun. 1, 2012 (JP) .................. 2012-126035

(51) Int. Cl.
| | |
|---|---|
| *H05B 37/00* | (2006.01) |
| *F21V 29/00* | (2015.01) |
| *H05B 33/08* | (2006.01) |
| *F21V 19/00* | (2006.01) |
| *F21V 23/00* | (2015.01) |
| *H05K 1/02* | (2006.01) |
| *F21V 29/74* | (2015.01) |
| *F21V 3/00* | (2015.01) |
| *F21Y 101/02* | (2006.01) |
| *F21Y 105/00* | (2006.01) |
| *H05K 3/00* | (2006.01) |

(52) U.S. Cl.
CPC ............... *F21V 29/22* (2013.01); *F21V 19/004* (2013.01); *F21V 23/005* (2013.01); *F21V 29/20* (2013.01); *F21V 29/74* (2015.01); *H05B 33/0803* (2013.01); *H05B 33/0824* (2013.01); *H05K 1/0204* (2013.01); *F21V 3/00* (2013.01); *F21Y 2101/02* (2013.01); *F21Y 2105/001* (2013.01); *H05K 3/0061* (2013.01); *H05K 2201/09072* (2013.01); *H05K 2201/10106* (2013.01)

(58) Field of Classification Search
CPC . F21V 29/22; F21V 29/2206; F21V 29/2212; F21V 29/2262; H05B 33/083; H05K 2201/10106
See application file for complete search history.

(56) References Cited

U.S. PATENT DOCUMENTS

| | | | | |
|---|---|---|---|---|
| 7,901,993 B2 * | 3/2011 | Lin et al. | ........................ | 438/118 |
| 8,034,645 B2 * | 10/2011 | Lin et al. | .......................... | 438/26 |
| 8,076,182 B2 * | 12/2011 | Lin et al. | ........................ | 438/118 |

(Continued)

FOREIGN PATENT DOCUMENTS

JP    2009-218204 A    9/2009

*Primary Examiner* — Jeffrey Zweizig

(57) ABSTRACT

Providing a lighting device wherein provisions are made to be able to provide a sufficiently high dielectric strength while retaining the required heat-sink property even when a module substrate with a plurality of LED elements mounted thereon is reduced in size. A lighting device includes a module substrate on an upper surface of which are mounted a plurality of LED elements, a heat-sink member, having a raised portion, for dissipating heat generated by the plurality of LED elements, and an insulating sheet formed with an opening and interposed between a portion of the lower surface of the module substrate and the heat-sink member, and wherein the raised portion is formed so as to be located via the opening in close proximity to the lower surface of a region where the plurality of LED elements are mounted on the module substrate.

19 Claims, 7 Drawing Sheets

(56) References Cited

U.S. PATENT DOCUMENTS 8,632,221 B2 * 1/2014 Yeh ............................... 362/294
8,772,812 B2 * 7/2014 Yoshitake et al. ............... 257/98
8,872,445 B2 * 10/2014 Egawa et al. .................. 315/307
8,882,301 B2 * 11/2014 Heerden et al. ................ 362/294

* cited by examiner

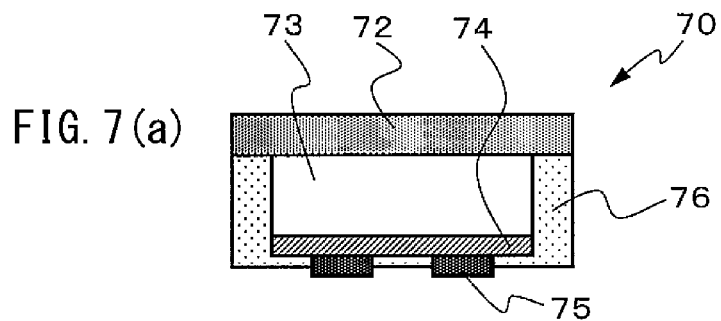
FIG. 7(a)
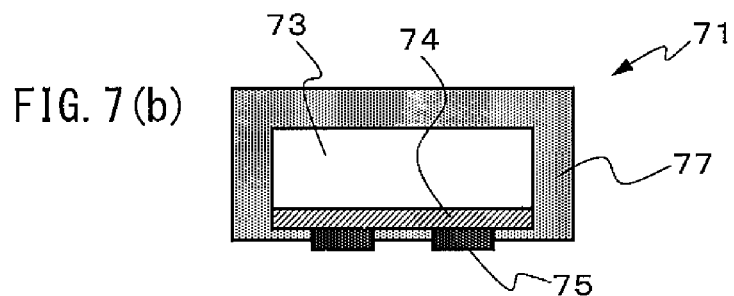
FIG. 7(b)
FIG. 8
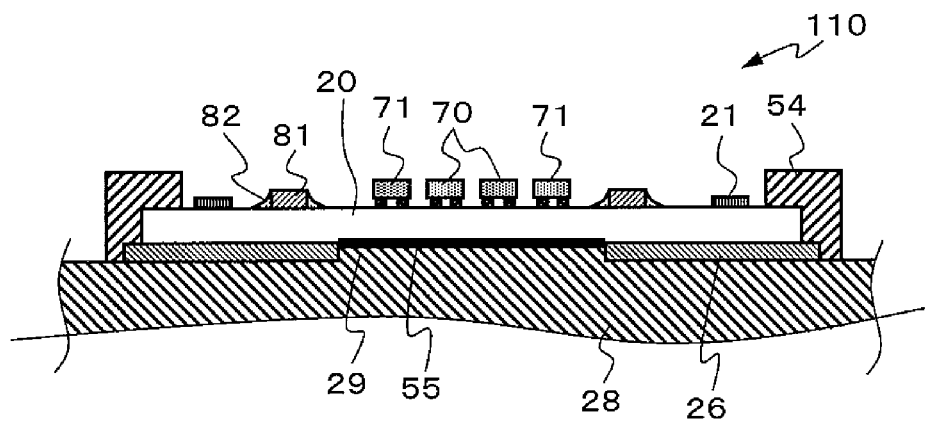

LIGHTING DEVICE

CROSS-REFERENCES TO RELATED APPLICATION

This application is a new U.S. patent application that claims benefit of JP 2012-126035, filed on Jun. 1, 2012, the entire content of JP 2012-126035 is hereby incorporated by reference.

TECHNICAL FIELD

The present invention relates to a lighting device that comprises a module substrate with a plurality of LED elements mounted thereon and a heat-sink member for dissipating heat generated by the LED elements.

BACKGROUND ART

Lighting equipment using LED elements has come into widespread use. To simplify design of lighting equipment such as desk lamps and other lighting lamps, it is common to modularize light source units. For example, FIG. 1 in a Japanese Unexamined Patent Publication No. 2009-218204 shows a light-emitting module 1 constructed by mounting a plurality of light-emitting elements 3 (packaged LED elements), a lighting circuit 4, and a connector 5 on the surface of a substrate 2 (a module substrate).

FIG. 11 is a plan view showing the surface of the light-emitting module 1 disclosed in the Japanese Unexamined Patent Publication No. 2009-218204.

The light-emitting module 1 shown in FIG. 11 comprises a disc-shaped substrate 2, and the light-emitting elements 3, lighting circuit components 4, and power supply connector 5 mounted on the substrate 2. The substrate 2 is made of aluminum formed in the shape of a disc, and has a thickness of about 1.5 mm and a diameter of about 70 mm. The upper surface 2a of the substrate 2 is a component mounting surface, and the lower surface 2b thereof provides a planar heat-sink surface. Further, an insulating layer is formed on the upper surface 2a of the substrate 2, and an interconnection pattern not shown is formed on the insulating layer.

Eight light-emitting elements 3, one spaced from another by a prescribed distance, are mounted in the center of the component mounting surface. The outer dimensions of each light-emitting element 3 are 3.5 mm square and about 1.5 mm high, and each element is a surface-mount LED element containing four LED dies. The lighting circuit components 4 are arranged along the outer periphery of the component mounting surface. The lighting circuit components 4 are components for controlling the lighting of the LED chips, and include a fuse F, a capacitor C, a rectifier REC, a voltage-regulating diode ZD, resistive elements R1 and R2, and a transistor Q. The connector 5 for connecting to utility power is located outside the array of the light-emitting elements 3. A white resist having high reflectivity is applied by printing over the component mounting surface of the substrate 2, and mounting screw holes 6 are formed at three places passing through the substrate 2.

FIG. 12 is a schematic diagram of a lighting device 10 constructed using the light-emitting module 1 disclosed in the Japanese Unexamined Patent Publication No. 2009-218204.

Since the light-emitting elements (LED elements) 3 generate heat during operation, the heat must be efficiently dissipated outside the lighting device. FIG. 4 in the Japanese Unexamined Patent Publication No. 2009-218204 shows how the light-emitting elements 3 are mounted on a heat sink (heat-sink member) 12 via the substrate 2. The lighting device 10 shown in FIG. 12 is a downlight and has a casing 11 fixedly mounted in a ceiling. The metal heat sink 12 provided with radiating fins is placed inside the casing 11, and the light-emitting module 1 equipped with a reflector 13 is mounted on the heat sink 12. The light-emitting module 1 is screwed to the casing 11 so that the heat-sink lower surface 2b of the substrate 2 is held in intimate contact with the heat sink 12 by interposing a silicone rubber sheet (not shown) therebetween. The reflector 13 is formed in the shape of a cup having a gently curved face, and its upper end has a mounting opening 13a, while its lower end provides a lighting opening 13b.

SUMMARY

An electrically conductive resin or a metal such as aluminum may be used as the material for the heat-sink member in order to enhance heat conductance. When applying a high voltage to the module substrate adjacent to the heat-sink member, the module substrate must be provided with a sufficiently high dielectric strength. One method known in the art to increase the dielectric strength is to increase the distance between the power supply terminal of the module substrate and the edge face of the module substrate. This method, however, increases the size of the module substrate. Another method known to provide increased dielectric strength is to interpose an insulating sheet between the module substrate and the heat-sink member; the silicone rubber sheet described with reference to FIG. 12 corresponds to this insulating sheet. The silicone rubber sheet also has the function of enhancing adhesion and providing stable heat conductance. However, if the dielectric strength is to be increased by using such an insulating sheet, the thickness of the insulating sheet has to be increased, and as a result, the heat-sink property has to be compromised.

It is an object of the present invention to provide a lighting device that comprises a module substrate with a plurality of LED elements mounted thereon and a heat-sink member for dissipating heat generated by the LED elements, wherein provisions are made to be able to provide a sufficiently high dielectric strength while retaining the required heat-sink property even when the module substrate is reduced in size.

There is provided a lighting device that includes a module substrate on an upper surface of which are mounted a plurality of LED elements, a heat-sink member, having a raised portion, for dissipating heat generated by the plurality of LED elements, and an insulating sheet formed with an opening and interposed between a portion of the lower surface of the module substrate and the heat-sink member, and wherein the raised portion is formed so as to be located via the opening in close proximity to the lower surface of a region where the plurality of LED elements are mounted on the module substrate.

Preferably, in the lighting device, the raised portion is in contact with the lower surface of the region where the plurality of LED elements are mounted on the module substrate.

Preferably, in the lighting device, a thermally conductive resin layer is interposed between the lower surface of the module substrate and the raised portion.

Preferably, in the lighting device, the insulating sheet is thicker than the raised portion, and the insulating sheet is formed in the shape of a box.

Preferably, in the lighting device, the module substrate is provided with a dam member enclosing the plurality of LED elements, and the LED elements are covered with a fluorescent resin.

Preferably, in the lighting device, a portion of a lighting circuit is mounted on the module substrate in a region outside the dam member, and the lighting circuit is covered with the fluorescent resin.

Preferably, in the lighting device, a portion of the dam member is used as a portion of a dam member enclosing the portion of the lighting circuit.

Preferably, in the lighting device, the module substrate is provided with a dam member enclosing the plurality of LED elements, and the plurality of LED elements are covered with a fluorescent resin.

Preferably, in the lighting device, the plurality of LED elements are packaged by being covered with a resin.

Preferably, in the lighting device, a portion of a lighting circuit for the plurality of LED elements is mounted on the module substrate.

Preferably, in the lighting device, the portion of the lighting circuit includes a diode bridge circuit, a bypass circuit, and an LED array formed by connecting the plurality of LED elements in series, wherein the diode bridge circuit is provided with a terminal for connecting to a utility AC power supply, the bypass circuit is provided with a first current input terminal, a second current input terminal, and a current output terminal, and the LED array is constructed from a plurality of sub-LED arrays, and wherein the first current input terminal of the bypass circuit is connected to a connection node between the sub-LED arrays, and a current input to the first current input terminal is controlled on and off according to a current input to the second current input terminal.

Preferably, in the lighting device, the bypass circuit includes a depletion-mode FET, wherein a drain of the FET is connected to the first current input terminal, and a source of the FET is connected to the second current input terminal.

Preferably, in the lighting device, the module substrate is formed from a ceramic as a base material.

Preferably, in the lighting device, the ceramic is white in color.

Preferably, the lighting device further comprises a holder, provided with a spring contact, for fixedly holding the module substrate in position, wherein the spring contact presses a power supply terminal on the module substrate and provides an electrical connection between the power supply terminal and external circuitry.

In the above lighting device, the module substrate is placed on the heat-sink member by interposing the insulating sheet therebetween. However, the insulating sheet is formed with an opening only in a region directly below the mounting region of the LED elements that generate heat, and the module substrate directly contacts the heat-sink member through this opening. That is, since the region directly below the terminal for receiving the power supply and the peripheral region of the module substrate are protected with the insulating sheet interposed between the module substrate and the heat-sink member, a high dielectric strength can be maintained. On the other hand, an efficient heat sink path can be secured because the module substrate directly contacts the heat-sink member in and near the mounting region of the LED elements. Accordingly, in the above lighting device, because of the use of the insulating sheet, sufficiently high dielectric strength can be provided while retaining the required heat-sink property even when the module substrate is reduced in size.

BRIEF DESCRIPTION OF THE DRAWINGS

Other features and advantageous of the present lighting apparatus will be apparent from the ensuing description, taken in conjunction with the accompanying drawings, in which:

FIG. 7(a) is a cross-sectional view of a packaged LED (LED element) 70 having a strong light distribution in the upward direction, and FIG. 7(b) is a cross-sectional view of a packaged LED (LED element) 71 having a light distribution in the sideways directions as well.

FIG. 8 is a cross-sectional view of an alternative light source section 110 of the lighting device.

DESCRIPTION

Figure 1A:
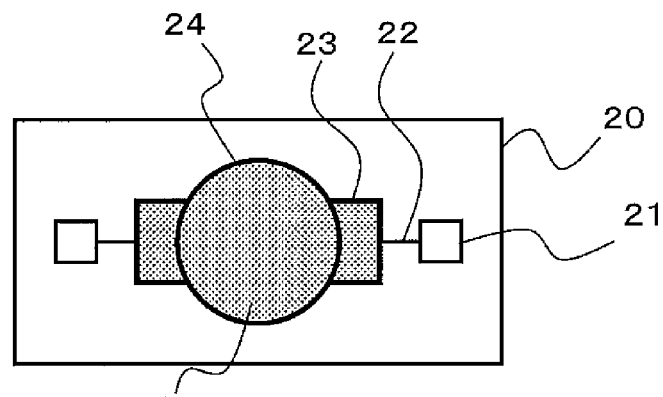
FIG. 1(a) is a plan view of a module substrate 20.

A lighting device will be described below with reference to the drawings. It will, however, be noted that the technical scope of the present invention is not limited to the specific embodiment described herein but extends to the inventions described in the appended claims and their equivalents. Further, throughout the drawings, the same or corresponding component elements are designated by the same reference numerals, and the description of such component elements, once given, will not be repeated thereafter.

Figure 1B:
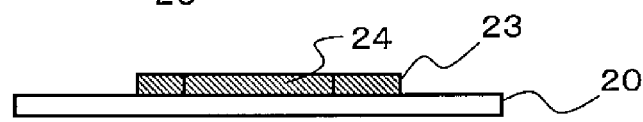
FIG. 1(b) is a front view of the module substrate 20.

FIG. 1(a) is a plan view of a module substrate 20, and FIG. 1(b) is a front view of the module substrate 20.

As shown in FIG. 1, a circular dam member 24 is provided in the center of the upper surface of the module substrate 20, and a rectangular dam member 23 connecting to the dam member 24 is provided outside the dam member 24. The region enclosed by the dam member 24, and the region enclosed by the dam member 23 and a portion of the dam member 24, are both filled with a fluorescent resin 25. A terminal wiring line 22 which passes under the dam member 23 extends in the left and right directions and is connected at each end to a power supply terminal 21. As will be described later (see FIG. 5), LED dies 51 are mounted in the region enclosed by the dam member 24, while electronic components 52 are mounted in the region enclosed by the dam member 23 and a portion of the dam member 24. In the lighting circuit 300 to be described later (see FIG. 6), the electronic components 52 correspond to the electronic components other than the LED dies 51, and constitute part of the lighting circuit 300. In FIG. 1(b), neither the terminal wiring line 22 nor the power supply terminal 21 is shown.

The module substrate 20 is a white ceramic whose base material is $AlO_2$, and has a thickness of about 300 to 1000 μm. White ceramic is an insulating material having high reflectivity and high thermal conductivity, and is therefore advantageous when it comes to reducing the size of the module substrate 20. Various kinds of materials can be selected for the module substrate 20 according to the required specifications; for example, use may be made of a material whose base material is aluminum nitride and whose surface is treated to provide a reflective surface, or a material whose base material is aluminum and whose surface is coated with an insulating layer. The dam members 23 and 24 are each formed from a silicone resin, and are 0.7 to 1.0 mm in thickness and 0.5 to 0.8 mm in height. The fluorescent resin 25 is a phosphor-containing silicone resin, and is about 400 to 700 μm in thickness. The terminal wiring line 22 and the power supply terminal 21 are each formed by depositing Ni and Au on top of Cu.

Figure 2A:
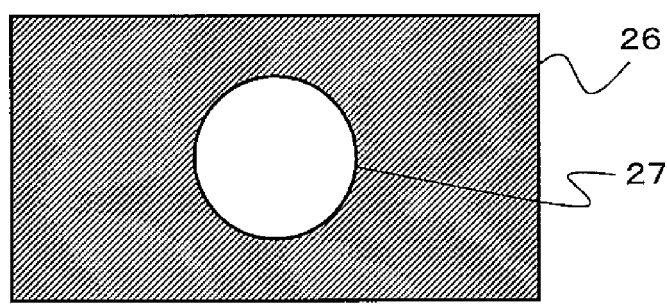
FIG. 2(a) is a plan view of an insulating sheet 26.
Figure 2B:
FIG. 2(b) is a front view of the insulating sheet 26.

FIG. 2(a) is a plan view of an insulating sheet 26, and FIG. 2(b) is a front view of the insulating sheet 26.

As shown in FIG. 2, the insulating sheet 26 has a top plan size slightly larger than that of the module substrate 20 shown in FIG. 1(a), and has an opening 27 in the center. The insulating sheet 26 is formed from an insulating resin, for example, a PI (polyimide) or PET (polyethylene terephthalate) resin. When forming the insulating sheet 26 from a PI resin, it is preferable to form it with a thickness of about 0.1 mm in order to secure a dielectric strength of 4 kV.

Figure 3A:
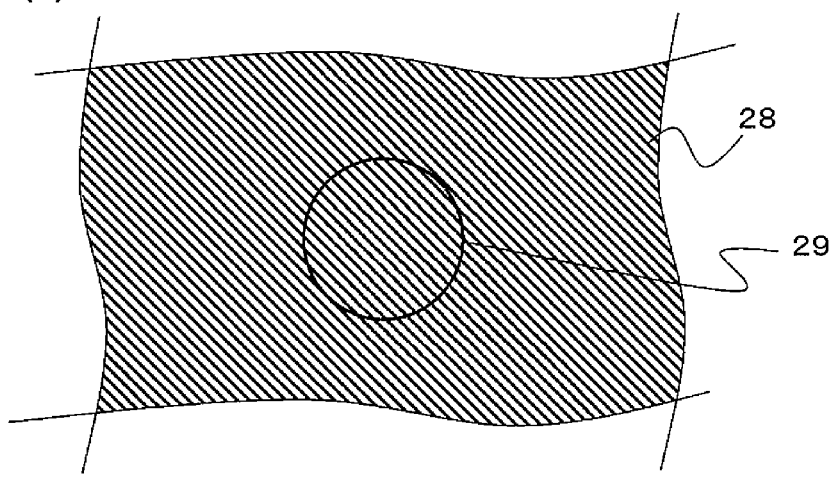
FIG. 3(a) is a plan view showing a portion of a heat-sink member 28.
Figure 3B:
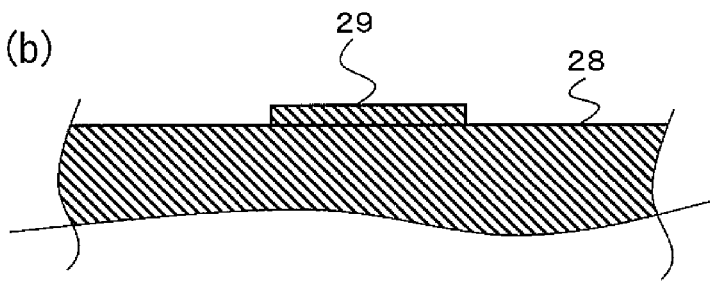
FIG. 3(b) is a front view showing the same portion of the heat-sink member 28.

FIG. 3(a) is a plan view showing a portion of a heat-sink member 28, and FIG. 3(b) is a front view showing the same portion of the heat-sink member 28.

As shown in FIG. 3, the heat-sink member 28 has a raised portion 29 on a flat upper surface. The heat-sink member 28 is formed from a thermally conductive material such as die-cast aluminum or a resin having high thermal conductivity. When forming the heat-sink member 28 from a resin, a suitable electrical insulation must be provided because the resin is made electrically conductive by mixing a carbon material in order to enhance thermal conductivity. It goes without saying that a suitable electrical insulation must also be provided when forming the heat-sink member 28 from die-cast aluminum.

Figure 4:
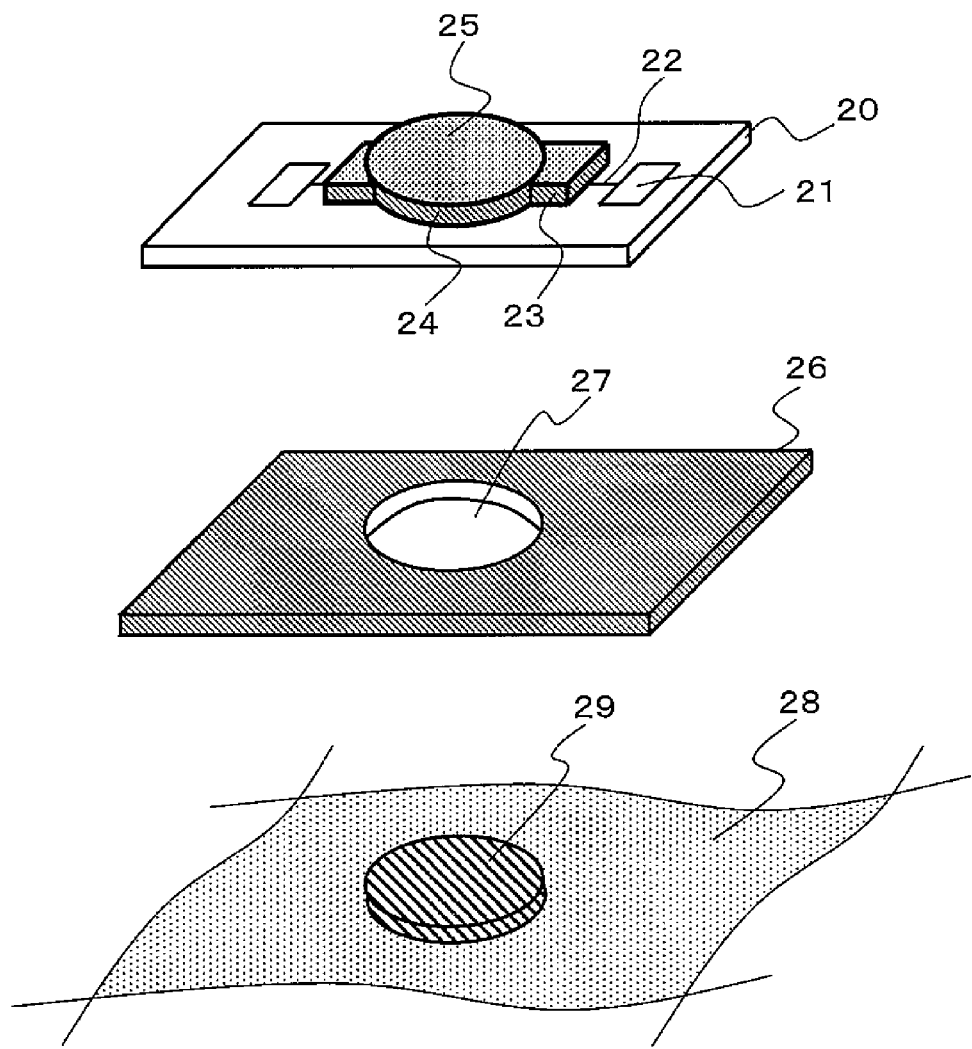
FIG. 4 is a diagram illustrating how the module substrate 20, insulating sheet 26, and heat-sink member 28 shown in FIGS. 1 to 3 are assembled together.

FIG. 4 is a diagram illustrating how the module substrate 20, insulating sheet 26, and heat-sink member 28 shown in FIGS. 1 to 3 are assembled together.

The light source section of the lighting device is constructed by stacking the insulating sheet 26 and the module substrate 20 one on top of the other on the heat-sink member 28. At this time, the raised portion 29 of the heat-sink member 28 is fitted into the opening 27 of the insulating sheet 26. In FIG. 4, the heat-sink member 28 is hatched differently from that shown in FIG. 3 in order to make the raised portion 29 easily distinguishable.

Figure 5:
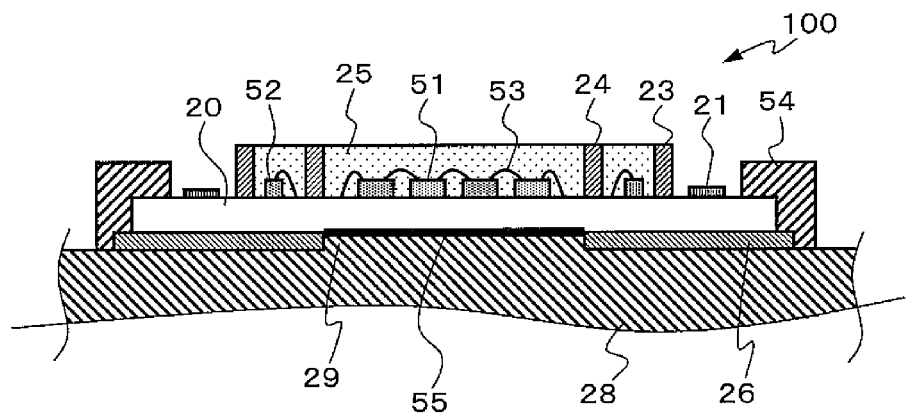
FIG. 5 is a cross-sectional view of a light source section 100 of a lighting device.

FIG. 5 is a cross-sectional view of the light source section 100 of the lighting device.

FIG. 5 shows a cross section of the light source section 100 of the lighting device fabricated by assembling together the module substrate 20, insulating sheet 26, and heat-sink member 28 shown in FIG. 4. The upper surface of the raised portion 29 of the heat-sink member 28 is covered with a thermally conductive silicone resin layer 55 via which the upper surface of the raised portion 29 and the lower surface of the module substrate 20 are connected together. The thermally conductive resin layer 55 serves to improve adhesion between the heat-sink member 28 and the module substrate 20 and to achieve smooth thermal conduction. The module substrate 20 is held fixedly to the heat-sink member 28 by a holder 54. The raised portion 29 may be made to directly contact the lower surface of the module substrate 20 without interposing the thermally conductive resin layer 55. That is, it is important that the raised portion 29 and the module substrate 20 be located in close proximity to each other to ensure good thermal conduction.

The LED dies (LED elements) 51 are mounted on the module substrate 20 by die bonding, and the connection between each LED die 51 is made by a wire 53. The LED die 51 located at each of the left and right ends is connected to a wiring line on the upper surface of the module substrate 20 (not shown in FIG. 5) by a wire 53. The array of the LED dies 51 is enclosed by the dam member 24 and covered with the fluorescent resin 25. In the region enclosed by the dam member 24 and the dam member 23, the electronic components 52 other than the LED dies 51 are mounted by die bonding and covered with the fluorescent resin 25. The electronic components 52 are connected to an interconnection pattern (not shown) by wires 53. The power supply feed line connecting to the power supply terminal 21 is not shown. The top plan size of each LED die 51 is, for example, about 500 μm×290 μm. In FIG. 5, four LED dies 51 are shown in the cross section, and each electronic component 52 is shown as being connected by one wire; however, this is only illustrative, and various other configurations are also possible.

Since the heat-sink member 28 and the module substrate 20 are made to contact with each other via the thermally conductive resin layer 55 in the region directly below the mounting region of the LED dies 51, as shown in FIG. 5, the light source section 100 of the lighting device achieves high heat-sink efficiency.

Further, the presence of the insulating sheet 26 directly below the power supply terminal 21 serves to provide high dielectric strength.

Figure 6:
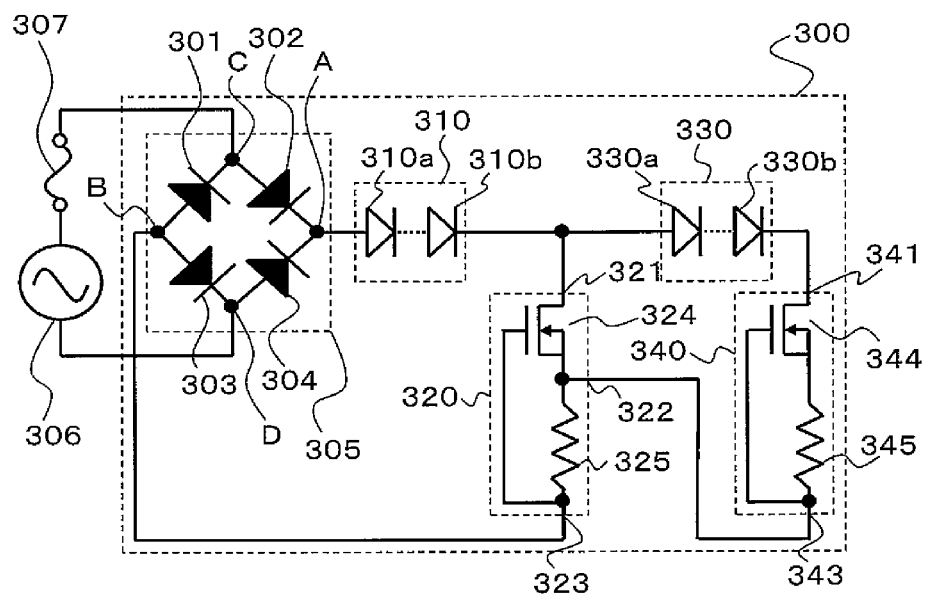
FIG. 6 is a circuit diagram showing one example of a lighting circuit 300 accommodated on the module substrate 20.

FIG. 6 is a circuit diagram showing one example of the lighting circuit 300 accommodated on the module substrate 20.

The lighting circuit 300 comprises a diode bridge circuit 305, a sub-LED array 310, a sub-LED array 330, a bypass circuit 320, and a current limiting circuit 340. In FIG. 6, the lighting circuit 300 is shown as being connected to a utility AC power supply 306 and a fuse 307. That is, the lighting circuit 300 can be connected to the utility AC power supply 306 by just adding a protective device such as the fuse 307. Further, since the number of LED elements operated to emit light varies according to the applied AC voltage, as will be described later, the lighting circuit 300 has the feature that the non-emission period is short, making flicker less noticeable and reducing high-frequency noise. Furthermore, since the number of electronic components other than the LED elements is small, the configuration of the lighting circuit 300 lends itself to reducing the size of the module substrate 20 (see FIGS. 1 and 5).

The diode bridge circuit 305 is constructed from four diodes 301, 302, 303, and 304, and has a full-wave rectified waveform output terminal A, a reference voltage application terminal B, and power supply terminals C and D. The power supply terminals C and D each correspond to the power supply terminal 21 in FIG. 1. The utility AC power supply 306 is connected to the terminal D and also to the terminal C via the fuse 307.

The LED array contained in the lighting circuit 300 is formed by connecting the sub-LED arrays 310 and 330 in series. Within the sub-LED array 310, a large number of LED dies 51 (see FIG. 5) including LED dies 310a and 310b are connected in series. Likewise, within the sub-LED array 330 also, a large number of LED dies 51 (see FIG. 5) including LED dies 330a and 330b are connected in series. The anode of the sub-LED array 310 is connected to the terminal A of the diode bridge circuit 305, and the cathode of the sub-LED array 310 is connected to the anode of the sub-LED array 330. The connection node between the sub-LED arrays 310 and 330 is connected to a current input terminal (first current input terminal) 321 of the bypass circuit 320. The cathode of the sub-LED array 330 is connected to a current input terminal 341 of the current limiting circuit 340.

The bypass circuit 320 includes, in addition to the current input terminal (first current input terminal) 321, a current input terminal (second current input terminal) 322 and a current output terminal 323. The current input terminal 322 is connected to a current output terminal 343 of the current limiting circuit 340, and the current output terminal 323 is connected to the terminal B of the diode bridge circuit 305. The bypass circuit 320 comprises a depletion-mode FET 324 and a resistor 325; the drain of the FET 324 is connected to the current input terminal 321, and the source of the FET 324 and one end of the resistor 325 are connected to the current input terminal 322, while the gate of the FET 324 and the other end of the resistor 325 are connected to the current output terminal 323. In the bypass circuit 320, the current flowing into the circuit from the current input terminal 321 is limited by the current flowing into the circuit from the current input terminal 322.

The current limiting circuit 340 has a circuit configuration substantially identical to that of the bypass circuit 320, the only difference being the absence of a terminal corresponding to the current input terminal 322 of the bypass circuit 320. An FET 344 and a resistor 345 are connected in the same manner as in the bypass circuit 320. The resistor 345 is smaller in value than the resistor 325, and the ratio of the resistance value of the resistor 345 to that of the resistor 325 is chosen to be 1:2.

The method of operation of the lighting circuit 300 will be described below.

The voltage of the full-wave rectified waveform begins to rise from 0 V, and when the voltage exceeds the threshold value of the sub-LED array 310, current flows through the sub-LED array 310 into the bypass circuit 320, and the sub-LED array 310 lights. At this time, feedback is applied through the resistor 325 to the source of the FET 324, and the bypass circuit 320 thus operates in a constant current mode. Since the forward voltage drop of each LED die (310a, etc.) is about 3 V, if the number of LED dies (310a, etc.) connected in series in the sub-LED array 310 is, for example, 20, the threshold value of the sub-LED array 310 is about 60 V. Similarly, if the number of LED dies (330a, etc.) connected in series in the sub-LED array 330 is, for example, 20, the threshold value of the sub-LED array 330 is about 60 V. Therefore, when the sub-LED arrays 310 and 330 are each formed by connecting 20 LED dies in series, the lighting circuit 300 can efficiently operate with the utility AC power supply 306 whose root-mean-square value is 100 V.

When the voltage of the full-wave rectified waveform further rises and exceeds the sum of the threshold values of the sub-LED arrays 310 and 330, current also begins to flow through the sub-LED array 330 into the current limiting circuit 340. When the current at the current input terminal 322 exceeds a predetermined value, the source voltage of the FET 324 increases, increasing the source-gate voltage, and the FET 324 turns off. At this time, feedback is applied through the resistor 345 to the FET 344, and the current limiting circuit 340 thus operates in a constant current mode. Accordingly, the sub-LED array 330 as well as the sub-LED array 310 lights. The process that takes place during the period that the voltage of the full-wave rectified waveform drops is the reverse of the process that takes place during the period that the voltage of the full-wave rectified waveform rises.

Since the connection configuration of the lighting circuit 300 is symmetrical and simple, the diodes 301 and 302 and the bypass circuit 320 are mounted, for example, in the electronic component mounting region to the right of the dam member 24 (the region enclosed by the dam members 23 and 24) in FIG. 1. On the other hand, the diodes 303 and 304 and the current limiting circuit 340 are mounted in the electronic component mounting region to the left of the dam member 24 (the region enclosed by the dam members 23 and 24). By thus mounting the electronic components, the LED dies 51 (see FIG. 5) and the other electronic components 52 (see FIG. 5) can be connected to the power supply terminals 21 (see FIG. 5) by providing wiring only on the upper surface of the module substrate (see FIGS. 1 and 5). On the other hand, if all of the diodes 301 to 304 are to be mounted in one or the other of the electronic component mounting regions, wire 53 (see FIG. 5) has to be routed so as to run over the wiring on the module substrate 20 only at one place.

While the lighting circuit 300 has been shown in FIG. 6 as including two sub-LED arrays 310 and 330, the lighting circuit 300 may be expanded to include three or more sub-LED arrays to construct the LED array. In that case, a bypass circuit is provided for each connection node between one sub-LED array and the next, and the connection node is connected to the first current input terminal of the bypass circuit. Further, the current output terminal of the bypass circuit located on the downstream side as viewed from the diode bridge circuit (if there is no downstream bypass circuit, then the current output terminal of the current limiting circuit) is connected (in cascade) with the second current input terminal of the upstream bypass circuit.

In the lighting circuit 300 of FIG. 6, the bypass circuit 320 has been shown as comprising the depletion-mode FET 324 and the resistor 325. However, the bypass circuit 320 may be constructed using two resistors in combination with an enhancement-mode FET and an NPN bipolar transistor. In that case, one resistor and the drain of the FET are connected to the current input terminal (first current input terminal), and the other end of the resistor is connected to the gate of the FET and the collector of the transistor. Then, the other resistor, the source of the FET, and the base of the transistor are connected to the second current input terminal. Further, the other end of that other resistor and the emitter of the transistor are connected to the current output terminal. In the bypass circuit thus constructed, the current input to the first current input terminal is limited by the current input to the second current input terminal. This bypass circuit can be constructed as a current limiting circuit by allowing the second current input terminal to float.

In the light source section 100 of the lighting device shown in FIG. 5, the LED dies 51 and the electronic components 52 are mounted on the module substrate 20 by die bonding and connected by wires 53. However, each LED element need not be limited to a bare chip LED die, but may be provided in the form of a packaged LED element (hereinafter called the packaged LED) constructed by covering an LED die with a resin or the like. Further, the mounting method of the electronic components need not be limited to die bonding and wiring, but a surface mounting method using solder joining may be employed. An alternative light source section 110 which uses packaged LEDs and in which the electronic components are mounted by soldering will be described below.

FIG. 7($a$) is a cross-sectional view of a packaged LED (LED element) 70 having a strong light distribution in the upward direction, and FIG. 7($b$) is a cross-sectional view of a packaged LED (LED element) 71 having a light distribution in the sideways directions as well.

In FIG. 7(a), the LED die includes a sapphire substrate 73, a semiconductor layer 74, and electrode bumps 75; here, the semiconductor layer 74 is formed on the lower surface of the sapphire substrate 73, and the two electrode bumps 75 are attached to the semiconductor layer 74. The side faces of the LED die and the bottom face thereof excluding the portions where the electrode bumps are formed are coated with a reflective member 76, and the top face of the LED die is coated with a fluorescent sheet 72. The reflective member 76 is formed by kneading fine reflective particles such as titanium oxide into a silicone resin, and is applied to a thickness of about 100 μm on the side faces. The reflective member 76 on the bottom face is provided to protect the bottom face of the LED die, and is about 10 μm in thickness. The fluorescent sheet 72 is formed by kneading fluorescent particles into a silicone resin and has a thickness of about 100 μm. The packaged LED 70 is a chip-size package (called a CSP) about the same size as the LED die.

In FIG. 7(b), the LED die is the same as that used in FIG. 7(a). The top and side faces of the LED die and the bottom face thereof excluding the portions where the electrode bumps are formed are coated with a fluorescent member 77. The fluorescent member 77 is formed by kneading fluorescent particles into a silicone resin, and is applied to a thickness of about 100 μm on the top face as well as on the side faces. The fluorescent member 77 on the bottom face is provided to protect the bottom face of the LED die, and is about 10 μm in thickness. The packaged LED 71 also is a chip-size package. While the packaged LED 70 has a strong light distribution in the upward direction because of the presence of the reflective member 76, the packaged LED 71 has a light distribution in the sideways directions as well because the side faces are also coated with the fluorescent member 77.

FIG. 8 is a cross-sectional view of the alternative light source section 110 of the lighting device.

The alternative light source section 110 shown in FIG. 8, like the light source section 100 shown in FIG. 5, is constructed by stacking the insulating sheet 26 and the module substrate 20 one on top of the other on the heat-sink member 28, with the raised portion 29 of the heat-sink member 28 fitted into the opening 27 of the insulating sheet 26. The upper surface of the raised portion 29 of the heat-sink member 28 is covered with the thermally conductive silicone resin layer 55 via which the upper surface of the raised portion 29 and the lower surface of the module substrate 20 are directly connected together. The module substrate 20 is held fixedly to the heat-sink member 28 by the holder 54.

The packaged LEDs (LED elements) 70 and 71 are flip-chip mounted on a predefined interconnection pattern (not shown) on the module substrate 20. In this case, the packaged LEDs 70 and 71 are each connected to the predefined interconnection pattern (not shown) by solder. The electronic components 81 such as the diodes, resistors, and FETs (see FIG. 6) are also connected to the predefined interconnection pattern (not shown) by solder 82. Using the packaged LEDs 70 and 71 and the surface-mount electronic components 81 serves to simplify the fabrication process because it eliminates the need for a wire bonder and a dispenser (which were used to form the dam members 23 and 24 (see FIGS. 1 and 5) and to dispense the fluorescent resin 25 (see FIGS. 1 and 5)). In the alternative light source section 110, the light distribution area is enlarged by arranging the packaged LEDs 71 along the periphery of the LED element mounting region and placing the packaged LEDs 70 in the center.

In the alternative light source section 110 also, high heat-sink efficiency can be achieved, because the heat-sink member 28 and the module substrate 20 are made to directly contact with each other in the region directly below the mounting area of the packaged LEDs 70 and 71. The alternative light source section 110 also provides high dielectric strength because of the presence of the insulating sheet 26 directly below the power supply terminals 21. In the alternative light source section 110, the circuit diagram of the lighting circuit formed on the module substrate 20 is the same as that shown in FIG. 6.

In the light source section 100, the LED dies 51 and the electronic components 52 are mounted on the module substrate 20 (see FIG. 5), while in the alternative light source section 110, the packaged LEDs 70 and 71 and the electronic components 81 are mounted on the module substrate 20 (see FIG. 8). However, in the light source section, the components other than the LED elements (the LED dies 51 or the packaged LEDs 70 and 71) may not be mounted on the module substrate. For example, the light source section may be constructed using a technology known as a COB (Chip On Board) module in which the LED dies mounted in the center of the module substrate are enclosed by a dam member and are entirely covered with a fluorescent resin. Since the COB module generates heat in the center of the module substrate, and a reduction in the size of the module substrate is demanded, the above-described light source structure is effective in satisfying both the heat-sink and dielectric strength requirements.

In the light source sections 100 and 110, the module substrate 20 has been described as being formed from a ceramic. However, since the ceramic, by its nature, easily breaks, the insulating sheet 26 may be made thicker than the raised portion 29 of the heat-sink member 28 by about 50 μm. In this case, the space between the bottom surface of the module substrate 20 and the upper surface of the raised portion 29 is filled with a thermally conductive resin such as silicone.

In the light source sections 100 and 110, the holder 54 may be extended toward the center of the module substrate 20 and may be provided with spring contacts. The spring contacts not only work to press the module substrate 20 fixedly in position, but also serve to electrically connect the power supply terminals on the module substrate 20 to external circuitry. This simplifies the electrical connection configuration, while at the same time, preventing the breakage of the module substrate made of ceramic.

Figure 9:
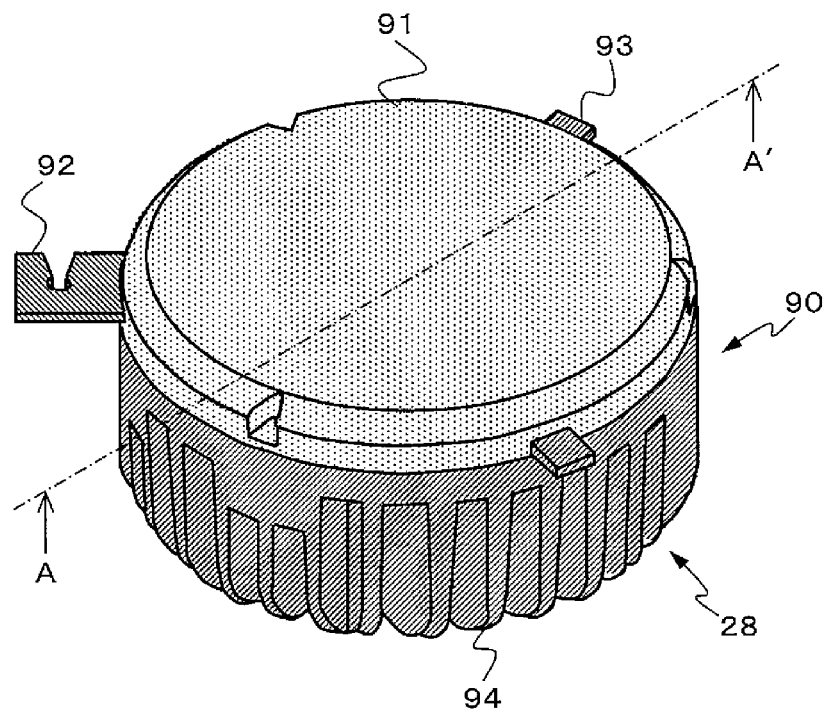
FIG. 9 is a perspective view of a lighting device 90.
Figure 10:
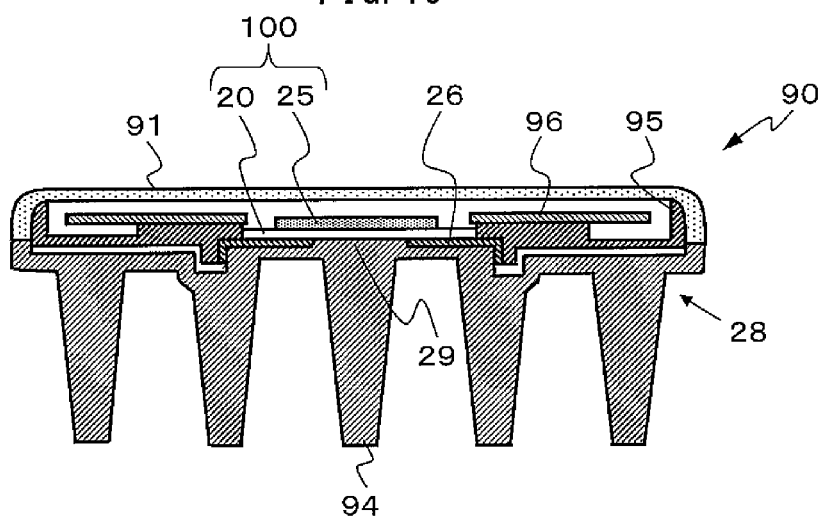
FIG. 10 is a cross-sectional view taken along AA' in FIG. 9.
Figure 11:
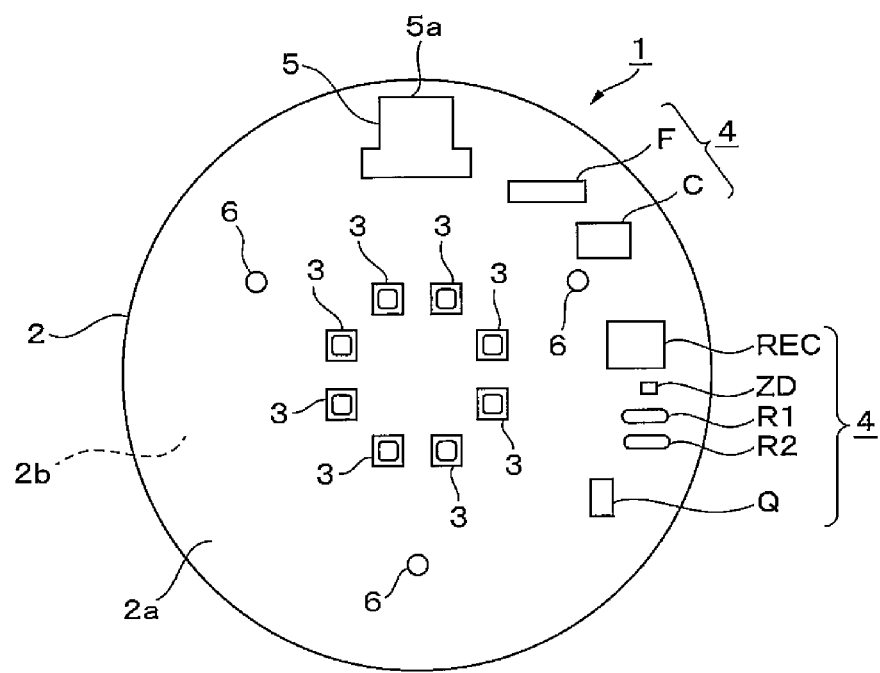
FIG. 11 is a plan view showing the surface of a light-emitting module 1 disclosed in the Japanese Unexamined Patent Publication No. 2009-218204.
Figure 12:
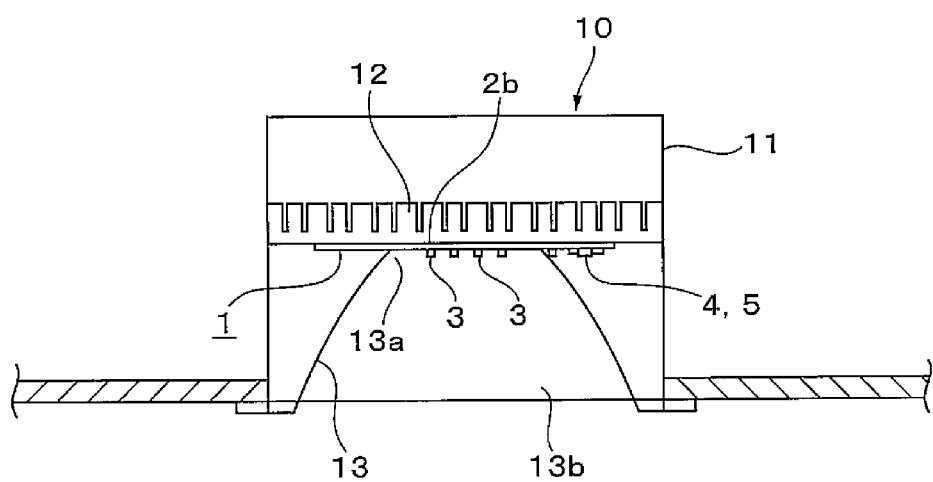
FIG. 12 is a schematic diagram of a lighting device 10 constructed using the light-emitting module 1 disclosed in the Japanese Unexamined Patent Publication No. 2009-218204.

FIG. 9 is a perspective view of a lighting device 90, and FIG. 10 is a cross-sectional view taken along AA' in FIG. 9.

The lighting device 90 is one example of the lighting device using the above-described light source section 100 (see FIG. 5), and includes a diffusing cover 91 for diffusing the light emitted from the light source section 100, and a heat-sink member 28 provided with many radiating fins 94. A power feed terminal 92 and two fixing members 93 protrude horizontally from the diffusing cover 91, as shown in FIG. 9. The power feed terminal 92 is used to supply dimmer control power to be described later, as well as power for lighting, to the circuit substrate 96 housed inside the diffusing cover 91. The fixing members 93 constitute part of the heat-sink member 28, and are formed integrally with the heat-sink member 28. The fixing members 93 and the power feed terminal 92 are used to mount the lighting device 90 fixedly to a lighting fixture or to a ceiling or the like.

The heat-sink member 28 includes the radiating fins 94 and the raised portion 29. The edge portion of the insulating sheet 26 provided around the raised portion 29 is bent downward in the figure. More specifically, the insulating sheet 26 is formed by a mold into the shape of a box whose top is provided with an opening in the center thereof and whose bottom is open. The bent portion of the insulating sheet 26 serves to improve the dielectric strength between the module substrate 20 and the heat-sink member 28. The light source section 100 containing the module substrate 20 and the fluorescent resin 25 (see FIG. 5) is mounted on the raised portion 29. The light source section 100 is fixed in position by a holder 95, and the circuit substrate 96 is fixed on the holder 95. Electronic components (not shown), including a controller for adjusting the brightness of the light source section 100, are mounted on the circuit substrate 96.

The diffusing cover 91 is fixed to the heat-sink member 28, and houses the upper part of the heat-sink member 28, the light source section 100, the holder 95, and the circuit substrate 96. In the figure, the insulating sheet 26, the holder 95, and the circuit substrate 96 are each shown as being separated between left and right, but actually each of these components is a single one-piece component. Further, the lighting device 90 incorporating the light source section 100 has been shown in FIGS. 9 and 10, but the lighting device 90 may be constructed to incorporate the light source section 110 (see FIG. 8).

The preceding description has been presented only to illustrate and describe exemplary embodiments of the present lighting apparatus. It is not intended to be exhaustive or to limit the invention to any precise form disclosed. It will be understood by those skilled in the art that various changes may be made and equivalents may be substituted for elements thereof without departing from the scope of the invention. In addition, many modifications may be made to adapt a particular situation or material to the teachings of the invention without departing from the essential scope. Therefore, it is intended that the invention not be limited to the particular embodiment disclosed as the best mode contemplated for carrying out this invention, but that the invention will include all embodiments falling within the scope of the claims. The invention may be practiced otherwise than is specifically explained and illustrated without departing from its spirit or scope.

What is claimed is:

1. A lighting device comprising:
a module substrate having an upper surface of which are mounted a plurality of LED elements;
a heat-sink member, having a raised portion, for dissipating heat generated by said plurality of LED elements; and
an insulating sheet formed with an opening and interposed between a portion of a lower surface of said module substrate and said heat-sink member,
wherein said raised portion is formed so as to be located via said opening in close proximity to a lower surface of a region where said plurality of LED elements are mounted on said module substrate, and
wherein said raised portion is in contact with the lower surface of said region where said plurality of LED elements are mounted on said module substrate.

2. The lighting device according to claim 1, wherein said insulating sheet is thicker than said raised portion.

3. The lighting device according to claim 1, wherein said plurality of LED elements are packaged by being covered with a resin.

4. The lighting device according to claim 3, wherein a portion of a lighting circuit for said plurality of LED elements is mounted on said module substrate.

5. The lighting device according to claim 4, wherein said lighting circuit includes a diode bridge circuit, a bypass circuit, and an LED array formed by connecting said plurality of LED elements in series,
said diode bridge circuit is provided with a terminal for connecting to a utility AC power supply,
said bypass circuit is provided with a first current input terminal, a second current input terminal, and a current output terminal, and
said LED array is constructed from a plurality of sub-LED arrays, and wherein
said first current input terminal of said bypass circuit is connected to a connection node between said sub-LED arrays, and a current input to said first current input terminal is controlled on and off according to a current input to said second current input terminal.

6. The lighting device according to claim 5, wherein said bypass circuit includes a depletion-mode FET, and wherein a drain of said FET is connected to said first current input terminal, and a source of said FET is connected to said second current input terminal.

7. The lighting device according to claim 1, wherein said module substrate is formed from a ceramic as a base material.

8. The lighting device according to claim 7, wherein said ceramic is white in color.

9. A lighting device comprising:
a module substrate having an upper surface of which are mounted a plurality of LED elements;
a heat-sink member, having a raised portion, for dissipating heat generated by said plurality of LED elements; and
an insulating sheet formed with an opening and interposed between a portion of a lower surface of said module substrate and said heat-sink member,
wherein said raised portion is formed so as to be located via said opening in close proximity to a lower surface of a region where said plurality of LED elements are mounted on said module substrate, and
wherein said insulating sheet is formed in the shape of a box.

10. The lighting device according to claim 9, wherein a thermally conductive resin layer is interposed between the lower surface of said module substrate and said raised portion.

11. A lighting device comprising:
a module substrate having an upper surface of which are mounted a plurality of LED elements;
a heat-sink member, having a raised portion, for dissipating heat generated by said plurality of LED elements; and
an insulating sheet formed with an opening and interposed between a portion of a lower surface of said module substrate and said heat-sink member,
wherein said raised portion is formed so as to be located via said opening in close proximity to a lower surface of a region where said plurality of LED elements are mounted on said module substrate,
wherein said module substrate is provided with a dam member enclosing said plurality of LED elements, and said LED elements are covered with a fluorescent resin, and
wherein a portion of a lighting circuit is mounted on said module substrate in a region outside said dam member, and said portion of said lighting circuit is covered with said fluorescent resin.

12. The lighting device according to claim 11, wherein a portion of said dam member is used as a portion of a dam member enclosing said portion of said lighting circuit.

13. The lighting device according to claim 11, wherein said lighting circuit includes a diode bridge circuit, a bypass circuit, and an LED array formed by connecting said plurality of LED elements in series,
said diode bridge circuit is provided with a terminal for connecting to a utility AC power supply, said bypass circuit is provided with a first current input terminal, a second current input terminal, and a current output terminal, and said LED array is constructed from a plurality of sub-LED arrays, and wherein said first current input terminal of said bypass circuit is connected to a connection node between said sub-LED arrays, and a current input to said first current input terminal is controlled on and off according to a current input to said second current input terminal.

14. The lighting device according to claim 13, wherein said bypass circuit includes a depletion-mode FET, and wherein a drain of said FET is connected to said first current input terminal, and a source of said FET is connected to said second current input terminal.

15. The lighting device according to claim 12, wherein said lighting circuit includes a diode bridge circuit, a bypass circuit, and an LED array formed by connecting said plurality of LED elements in series, said diode bridge circuit is provided with a terminal for connecting to a utility AC power supply, said bypass circuit is provided with a first current input terminal, a second current input terminal, and a current output terminal, and said LED array is constructed from a plurality of sub-LED arrays, and wherein said first current input terminal of said bypass circuit is connected to a connection node between said sub-LED arrays, and a current input to said first current input terminal is controlled on and off according to a current input to said second current input terminal.

16. The lighting device according to claim 15, wherein said bypass circuit includes a depletion-mode FET, and wherein a drain of said FET is connected to said first current input terminal, and a source of said FET is connected to said second current input terminal.

17. The lighting device according to claim 11, wherein a thermally conductive resin layer is interposed between the lower surface of said module substrate and said raised portion.

18. A lighting device comprising:
a module substrate having an upper surface of which are mounted a plurality of LED elements;
a heat-sink member, having a raised portion, for dissipating heat generated by said plurality of LED elements; and
an insulating sheet formed with an opening and interposed between a portion of a lower surface of said module substrate and said heat-sink member,
wherein said raised portion is formed so as to be located via said opening in close proximity to a lower surface of a region where said plurality of LED elements are mounted on said module substrate,
a holder, provided with a spring contact, for fixedly holding said module substrate in position,
wherein said spring contact presses a power supply terminal on said module substrate and provides an electrical connection between said power supply terminal and external circuitry.

19. The lighting device according to claim 18, wherein a thermally conductive resin layer is interposed between the lower surface of said module substrate and said raised portion.

* * * * *